United States Patent
Karnutsch et al.

(10) Patent No.: US 7,195,991 B2
(45) Date of Patent: Mar. 27, 2007

(54) METHOD FOR PRODUCING AN ELECTROMAGNETIC RADIATION-EMITTING SEMICONDUCTOR CHIP AND A CORRESPONDING ELECTROMAGNETIC RADIATION-EMITTING SEMICONDUCTOR CHIP

(75) Inventors: Christian Karnutsch, Karlsruhe (DE); Peter Stauss, Pettendorf (DE); Klaus Streubel, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 19 days.

(21) Appl. No.: 10/524,186

(22) PCT Filed: Aug. 21, 2003

(86) PCT No.: PCT/DE03/02786

§ 371 (c)(1),
(2), (4) Date: Feb. 8, 2005

(87) PCT Pub. No.: WO2004/021457

PCT Pub. Date: Mar. 11, 2004

(65) Prior Publication Data

US 2006/0003467 A1 Jan. 5, 2006

(30) Foreign Application Priority Data

Aug. 26, 2002 (DE) ................ 102 39 045

(51) Int. Cl.
*H01L 21/00* (2006.01)
(52) U.S. Cl. .................................................... 438/478
(58) Field of Classification Search ............. 372/44.01; 117/89; 438/478
See application file for complete search history.

(56) References Cited

U.S. PATENT DOCUMENTS

| | | | |
|---|---|---|---|
| 3,745,423 A | 7/1973 | Kasano | |
| 4,218,270 A | 8/1980 | Hasegawa et al. | |
| 5,003,548 A * | 3/1991 | Bour et al. | 372/44.01 |
| 5,233,204 A | 8/1993 | Fletcher et al. | |
| 6,530,991 B2 * | 3/2003 | Tanaka et al. | 117/89 |

FOREIGN PATENT DOCUMENTS

WO WO 02/09242 1/2002

OTHER PUBLICATIONS

Modak, P. et al., "InAlGaP Microcavity LEDs on Ge-substrates", *Journal of Crystal Growth*, vol. 221, pp. 668-673, 2000.
Wang, XL. Et al., "Si and Zn Doping of GaP Grown by OMVPE Using Tretiarybutylphosphine", *Journal of Crystal Growth*, vol. 158, pp. 49-52, 1996.

* cited by examiner

*Primary Examiner*—Carl Whitehead, Jr.
*Assistant Examiner*—Monica D. Harrison
(74) *Attorney, Agent, or Firm*—Fish & Richardson P.C.

(57) ABSTRACT

In a method of fabricating a radiation-emitting semiconductor chip based on AlGaInP, comprising the method steps of preparing a substrate, applying to the substrate a semiconductor layer sequence comprising a photon-emitting active layer, and applying a transparent decoupling layer comprising $(Ga_x(In_yAl_{1-y})_{1-x}P$ wherein $0.8 \leq x$ and $0 \leq y \leq 1$, it is provided according to the invention that the substrate is made of germanium and that the transparent decoupling layer is applied at low temperature.

11 Claims, 1 Drawing Sheet

METHOD FOR PRODUCING AN ELECTROMAGNETIC RADIATION-EMITTING SEMICONDUCTOR CHIP AND A CORRESPONDING ELECTROMAGNETIC RADIATION-EMITTING SEMICONDUCTOR CHIP

CROSS-REFERENCE TO RELATED APPLICATIONS

This application is the National Stage of International Application No. PCT/DE2003/002786, filed Aug. 21, 2003, which claims the benefit of German Patent Application Serial No. 10239045.2, filed on Aug. 26, 2002. The contents of both applications are hereby incorporated by reference in their entireties.

BACKGROUND OF THE INVENTION

In this context, materials based on InGaAlP include in particular all mixed crystals whose composition falls under the formula $(Ga_x(In_yAl_{1-y})_{1-x}P$, wherein $0 \leq x \leq 1$, $0 \leq y \leq 1$ and $x+y \leq 1$. Electromagnetic-radiation-emitting semiconductor chips based on AlGaInP include all semiconductor chips in which the semiconductor layer sequence in which an electromagnetic-radiation-generating layer is disposed comprises at least a substantial proportion of InGaAlP-based material and the properties of the radiation emitted by the semiconductor chip are at least substantially determined by the InGaAlP-based material.

This material based on InGaAlP need not necessarily have a composition that is mathematically exactly that of the above formula. Rather, it can include one or more dopants and additional constituents.

The AlGaInP material system is very attractive for use in light-emitting diodes (LEDs), since its bandgap can be adjusted by varying the Al content over a broad range of 1.9 to 2.2 eV. This means that LEDs can be made from this material in the color range of red to green.

To fabricate such LEDs by epitaxy, a substrate is needed on which the various semiconductor layers in the sequence can be deposited insofar as possible in monocrystalline form. Such a substrate for the epitaxy of AlGaInP-based LEDs should meet the following conditions:

it should have a lattice constant that enables the material systems AlGaInP and AlGaAs to be deposited in monocrystalline form, it should remain sufficiently solid at the process temperatures used, and it should be available commercially in sufficiently good quality.

All the aforesaid conditions are met by GaAs substrates. GaAs is consequently used throughout the world as a substrate for AlGaInP LEDs. From the standpoint of economical LED manufacture, however, GaAs substrates have the disadvantage of being expensive and containing arsenic. Other substrate materials either have a high lattice mismatch or are not adequately suited for the usual process steps.

SUMMARY OF THE INVENTION

The object of the invention is, therefore, to provide a method of the species cited at the beginning hereof that permits the technically simple and low-cost fabrication of a radiation-emitting semiconductor chip based on AlGaInP.

This object is achieved by means of a method having features described herein Further advantageous embodiments and improvements of the method will emerge An electromagnetic-radiation-emitting semiconductor chip that can be fabricated according to the method of the invention is also described herein. Advantageous embodiments and improvements of the semiconductor chip will also emerge in the following description.

An electromagnetic-radiation-emitting semiconductor chip that can be fabricated according to the method of the invention constitutes the subject matter of Claim 9. Advantageous embodiments and improvements of the semiconductor chip of the invention form the subject matter of dependent Claims 10 and 11.

The invention concerns a method of fabricating an electromagnetic-radiation-emitting semiconductor chip based on AlGaInP, comprising the method steps of: preparing a substrate; applying to the substrate a semiconductor layer sequence comprising a photon-emitting active layer; and applying a transparent decoupling layer, particularly a decoupling layer comprising $(Ga_x)In_yAl_{1-y})_{1-x}P$, wherein $0.8 \leq x$ and $0 \leq y \leq 1$. The invention also concerns an electromagnetic-radiation-emitting semiconductor chip based on AlGaInP, comprising a substrate, a semiconductor layer sequence applied to the substrate and comprising a photon-emitting active layer, and a transparent decoupling layer disposed on the active layer and comprising GaP.

It is provided according to the invention, in a fabrication method of the species cited at the beginning hereof, that the substrate is substantially composed of germanium and that the transparent decoupling layer is applied at low temperature. Germanium has a lattice constant that is readily tolerated with the material systems AlGaInP and AlGaAs and is available commercially in high quality. Moreover, the price of a germanium substrate is only about half the price of a GaAs substrate, resulting in great savings potential for the production process.

The lower thermal stability of germanium compared to GaAs is taken into account by the fact that the especially critical step of growing the gallium-phosphide-containing transparent decoupling layer is performed at a low temperature at which the germanium substrate still has adequate solidity and a low vapor pressure.

In a preferred embodiment of the method of the invention, it is provided that the transparent decoupling layer is applied in the form of a phosphorus source, using tertiary butyl phosphine (TBP, $(C_4H_9)PH_2$). Conventional LEDs based on AlGaInP typically involve the use of a light-decoupling layer of GaP which is deposited epitaxially, using phosphine ($PH_3$), at a temperature above 800° C. Such reactor temperatures are too high for processes involving germanium substrates. The use of tertiary butyl phosphine as a phosphorus source, however, makes it possible to deposit a high-quality light-decoupling layer at much lower process temperatures.

In particular, it is especially advantageous to apply the transparent decoupling layer at a temperature below 780° C., preferably below 750° C.

It is particularly preferred if the transparent decoupling layer is applied at a temperature of about 700° C.

It is also frequently advantageous to apply the transparent decoupling layer using trimethyl gallium as a gallium source.

Given a typical lateral dimension for the active layer of A=250 μm, the thickness of the decoupling layer is then selected to be between about 1 μm and about 10 μm, preferably between about 2 μm and about 10 μm.

In an advantageous embodiment of the method of the invention, the transparent decoupling layer is grown by metal-organic vapor-phase epitaxy (MOVPE).

During the growth of the transparent decoupling layer, the V:III ratio is advantageously adjusted to a value of 5 to 20, preferably about 10.

Further advantageous embodiments, features and details of the invention will emerge from the dependent claims, the description of the embodiment example and the drawing.

Further advantages, preferred embodiments and improvements of the invention will emerge from the following explanation of an embodiment example in conjunction with the drawing. Only the elements essential to an understanding of the invention are represented.

BRIEF DESCRIPTION OF THE DRAWINGS

The single FIGURE is a schematic diagram of a sectional view of a radiation-emitting semiconductor chip according to an embodiment example of the invention.

DETAILED DESCRIPTION OF THE PREFERRED EMBODIMENTS

Figure 1:
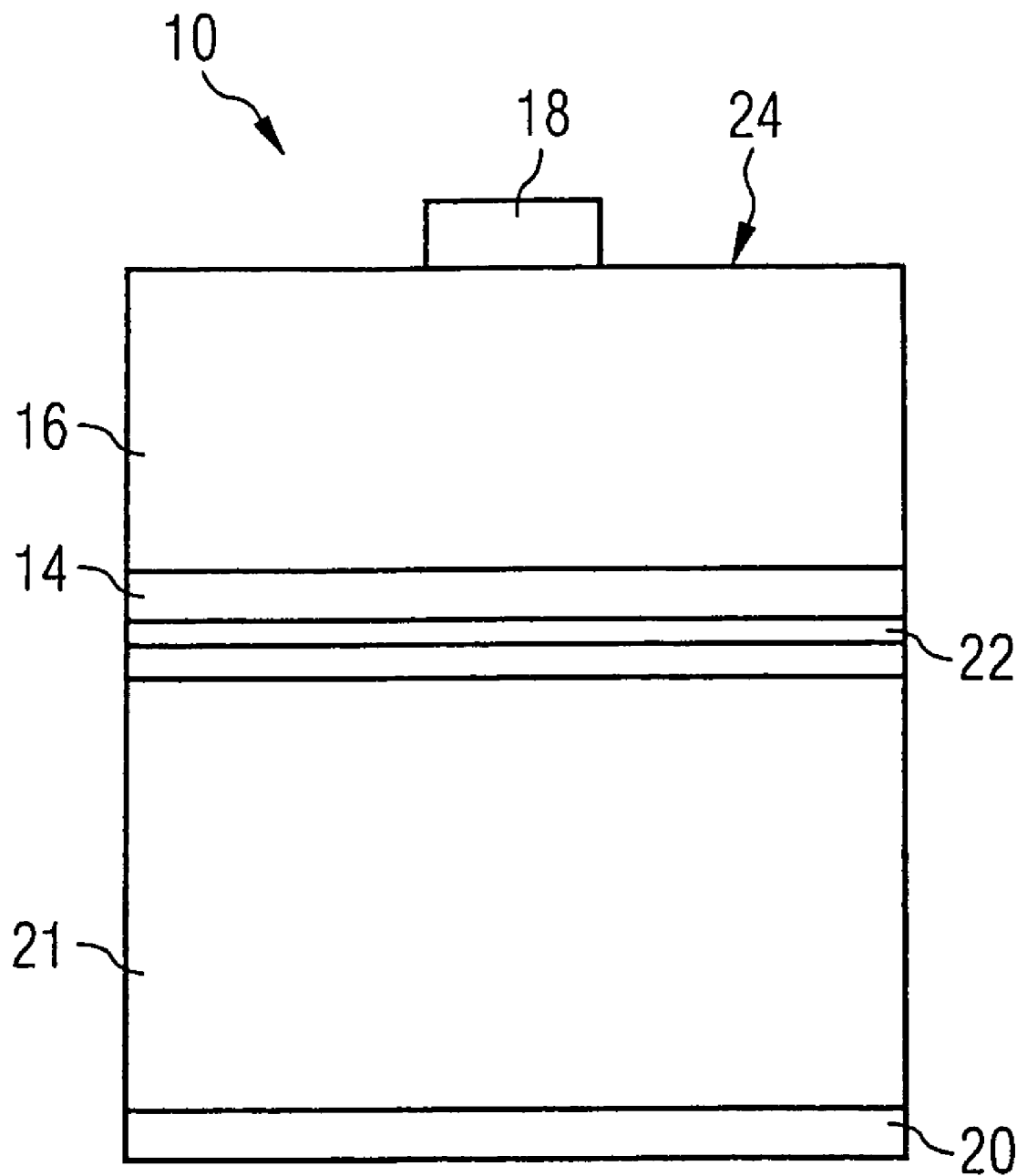
FIG. 1 is a sectional view of an AlGaInP-based LED chip 10 generally denoted by 10, shown in schematic representation.

The LED chip 10 comprises a germanium substrate 12 on which a semiconductor layer sequence 14 is formed. In the embodiment example, the semiconductor layer sequence 14 is a double heterostructure comprising an active, photon-emitting, AlGaInP-based n-type layer 22 enclosed by an AlGaInP-based n-type confining layer under the active layer an AlGaInP-based p-type confining layer over the active layer. Structures and layer sequences of this kind are known to the skilled person and therefore will not be described more thoroughly here. The aforesaid layers are doped to the desired impurity content with suitable p-dopants such as Zn, C or Mg or with suitable n-dopants such as Te, Se, S and Si, respectively, as known in the art.

The active semiconductor layer sequence 14 can alternatively comprise a multiquantum well structure, as also known, for example, from the prior art.

Applied to the p-type AlGaInP confining layer is a thick light-decoupling layer 16 of $(Ga_x(In_yAl_{1-y})_{1-x}P$, wherein $0.8 \leq x$ and $0 \leq y \leq 1$, or of GaP. Since the bandgap of the decoupling layer is greater than that of the active layer, light-decoupling layer 16 is transparent to electromagnetic radiation generated in active layer sequence 14.

In the case illustrated, the necessary current for powering the LED chip is supplied to the active layer of the LED chip 10 via a front-side contact 18 and a back-side contact 20. However, the contacts can alternatively be arranged otherwise than as explicitly shown in the embodiment example.

Light-decoupling layer 16 is applied by organometallic vapor-phase epitaxy (OMVPE). Tertiary butyl phosphine (TBP,$(C_4H_9)PH_2$) is used as a phosphorus source and trimethyl gallium as a gallium source, and a V:III flux ratio of about 10 is selected. The growth temperature in the embodiment example is 720° C., a temperature at which the germanium substrate is still sufficiently solid in the reactor.

In the embodiment example, layer sequence 14 has a cross section of 250 μm×250 μm and a layer thickness of between 2 and 10 μm.

The features of the invention disclosed in the foregoing description, in the drawing and in the claims can be essential to the practice of the invention both individually and in any combination.

The invention claimed is:

1. A method of fabricating a radiation-emitting semiconductor chip based on AlGaInP, comprising the method steps of:
   preparing a substrate;
   applying to said substrate a semiconductor layer sequence comprising a photon-emitting active layer; and
   applying a transparent decoupling layer, wherein
   said substrate is formed substantially of germanium and said transparent decoupling layer is applied in a temperature range extending no higher than 800° C.

2. The method as described in claim 1, wherein said transparent decoupling layer is applied with the use of tertiary butyl phosphine as a phosphorus source.

3. The method as described in claim 1, wherein said transparent decoupling layer is applied at a temperature below 780° C., preferably below 750° C.

4. The method as described in claim 1, wherein said transparent decoupling layer is applied at a temperature of about 700° C.

5. The method as described in claim 1, wherein said transparent decoupling layer is applied with the use of trimethyl gallium as a gallium source.

6. The method as described in claim 1, wherein said transparent decoupling layer is grown by organometallic vapor-phase epitaxy (OMVPE).

7. The method as described in claim 2, wherein said decoupling layer comprises $Ga_x(In_yAl_{1-y})_{1-x}P$ wherein $0.8 \leq x$ and $0 \leq y \leq 1$, particularly GaP.

8. The method as described in claim 6, wherein said transparent decoupling layer is grown with a V:III ratio of 5 to 20, preferably of about 10.

9. A radiation-emitting semiconductor chip based on AlGaInP comprising:
   a substrate;
   a semiconductor layer sequence applied to said substrate and comprising a photon-emitting active layer; and
   a transparent decoupling layer disposed on said semiconductor layer sequence, wherein said substrate is formed of germanium.

10. The radiation-emitting semiconductor chip as described in claim 9, wherein said transparent decoupling layer comprises $Ga_x(In_yAl_{1-y})_{1-x}P$ wherein $0.8 \leq x$ and $0 \leq y \leq 1$, particularly GaP.

11. The radiation-emitting semiconductor chip as described in claim 9, wherein said transparent decoupling layer has a thickness of between about 1 μm and about 10 μm, particularly of between about 2 μm and about 10 μm.

* * * * *